(12) United States Patent
Koshimizu

(10) Patent No.: US 11,955,314 B2
(45) Date of Patent: Apr. 9, 2024

(54) PLASMA PROCESSING APPARATUS

(71) Applicant: TOKYO ELECTRON LIMITED, Tokyo (JP)

(72) Inventor: Chishio Koshimizu, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 808 days.

(21) Appl. No.: 16/737,335

(22) Filed: Jan. 8, 2020

(65) Prior Publication Data

US 2020/0219701 A1 Jul. 9, 2020

(30) Foreign Application Priority Data

Jan. 9, 2019 (JP) ................................. 2019-001914
Nov. 28, 2019 (JP) ................................. 2019-215425

(51) Int. Cl.
*H01L 21/00* (2006.01)
*H01G 5/013* (2006.01)
*H01J 37/32* (2006.01)

(52) U.S. Cl.
CPC ..... *H01J 37/32082* (2013.01); *H01G 5/0132* (2013.01); *H01J 37/32568* (2013.01); *H01J 37/32715* (2013.01); *H01J 2237/2007* (2013.01)

(58) Field of Classification Search
None
See application file for complete search history.

(56) References Cited

U.S. PATENT DOCUMENTS

| 2006/0008594 A1* | 1/2006 | Kang ............... H01J 37/32018 118/723 E |
| 2006/0196605 A1* | 9/2006 | Ikegami ........... H01J 37/32082 118/728 |
| 2010/0006225 A1* | 1/2010 | Yokogawa ........ H01J 37/32935 156/345.28 |
| 2010/0203736 A1* | 8/2010 | Ichino .............. H01J 37/32183 257/E21.218 |
| 2019/0122864 A1* | 4/2019 | Aramaki .......... H01J 37/32174 |
| 2019/0206703 A1* | 7/2019 | Zhao ................ H01L 21/67109 |

(Continued)

FOREIGN PATENT DOCUMENTS

| CN | 101720501 A | 6/2010 |
| CN | 101847558 A | 9/2010 |

(Continued)

*Primary Examiner* — Sylvia MacArthur
*Assistant Examiner* — Michelle Crowell
(74) *Attorney, Agent, or Firm* — XSENSUS LLP

(57) ABSTRACT

An apparatus for plasma processing includes a chamber, a substrate support having a lower electrode and an electrostatic chuck disposed on the lower electrode and configured to support a substrate mounted on the electrostatic chuck in the chamber, and a radio frequency power supply configured to supply a radio frequency power to generate plasma in the chamber. Further, in the apparatus, a bias power supply supplies a bias power. A first electrical path electrically connects the bias power supply and the lower electrode, and a second electrical path that is different from the first electrical path and the lower electrode is configured to supply the bias power from the lower electrode or the first electrical path to an edge ring disposed to surround an edge of the substrate. Further, an impedance adjuster provides a variable impedance to the second electrical path.

20 Claims, 11 Drawing Sheets

(56) References Cited

U.S. PATENT DOCUMENTS

| | | | | |
|---|---|---|---|---|
| 2020/0185193 A1* | 6/2020 | Koshimizu | ....... | H01J 37/32577 |
| 2021/0407772 A1* | 12/2021 | Koshimizu | ....... | H01J 37/32568 |
| 2022/0037129 A1* | 2/2022 | Koshimizu | ....... | H01J 37/32706 |
| 2023/0091584 A1* | 3/2023 | Torii | ................ | H01J 37/32183 |
| | | | | 315/111.21 |

FOREIGN PATENT DOCUMENTS

| | | | |
|---|---|---|---|
| JP | 2008-514531 A | 5/2008 |
| JP | 2008-227063 A | 9/2008 |
| JP | 2010-186841 A | 8/2010 |
| JP | 2012-104382 A | 5/2012 |
| TW | 201119524 A | 6/2011 |
| TW | 201334270 A | 8/2013 |
| TW | 201832620 A | 9/2018 |
| WO | 2006/017340 A2 | 2/2006 |
| WO | 2009/006062 A1 | 1/2009 |
| WO | 2013/112281 A1 | 8/2013 |
| WO | 2018/144374 A1 | 8/2018 |

* cited by examiner

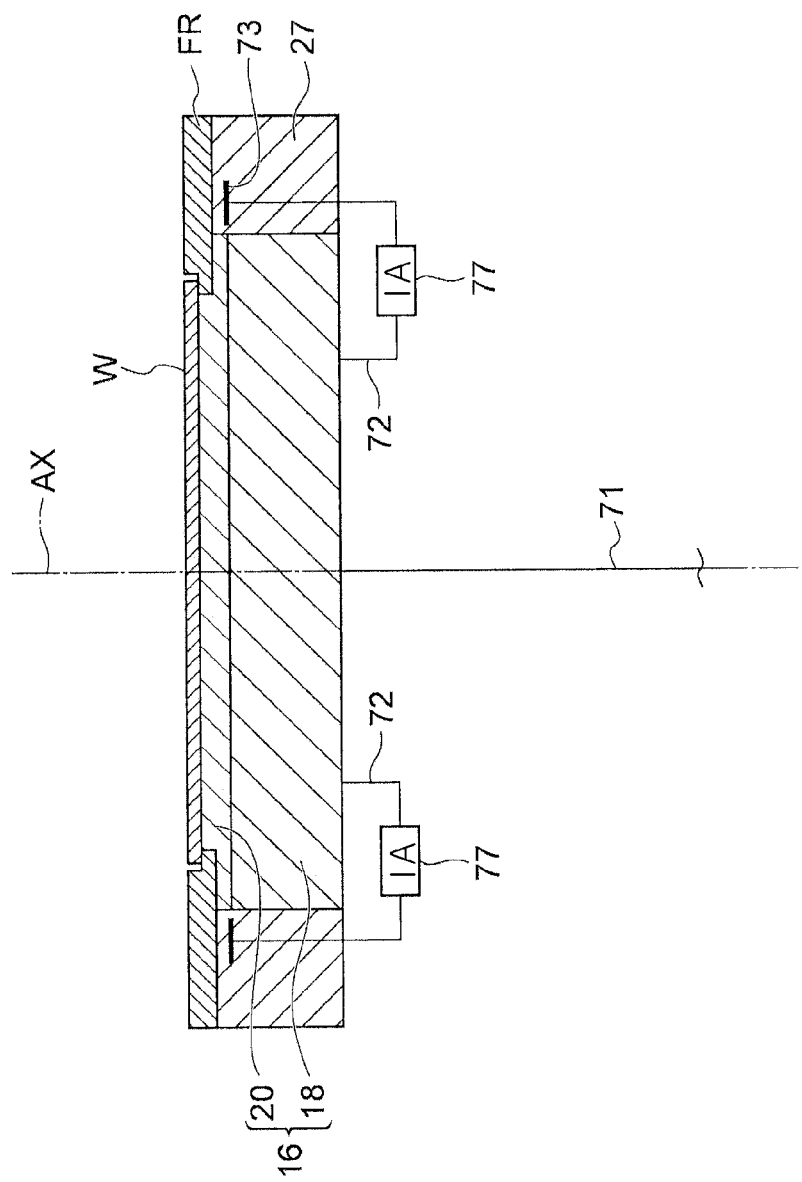

PLASMA PROCESSING APPARATUS

CROSS-REFERENCE TO RELATED APPLICATIONS

This application claims priority to Japanese Patent Application Nos. 2019-001914 and 2019-215425, filed on Jan. 9, 2019 and Nov. 28, 2019, the entire contents of which are incorporated herein by reference.

TECHNICAL FIELD

The present disclosure relates to a plasma processing apparatus.

BACKGROUND

In plasma etching for a substrate, a plasma processing apparatus is used. The plasma processing apparatus includes a chamber, an electrostatic chuck, and a lower electrode. The electrostatic chuck and the lower electrode are disposed in the chamber. The electrostatic chuck is disposed on the lower electrode. The electrostatic chuck supports a focus ring mounted thereon. The electrostatic chuck supports a substrate disposed in a region surrounded by the focus ring. When etching is performed in the plasma processing apparatus, gas is supplied into the chamber. Further, a radio frequency power is supplied to the lower electrode. Plasma is generated from the gas in the chamber. The substrate is etched by chemical species such as ions and radicals from the plasma.

When plasma etching is performed, the focus ring is consumed and a thickness of the focus ring is reduced. When the thickness of the focus ring is reduced, a position of a top end of a plasma sheath (hereinafter, referred to as "sheath") above the focus ring is lowered. A vertical position of the top end of the sheath above the focus ring and a vertical position of a top end of a sheath above the substrate should be the same. Therefore, Japanese Patent Application Publication No. 2008-227063 discloses a plasma processing apparatus capable of adjusting the vertical position of the top end of the sheath above the focus ring. The plasma processing apparatus disclosed in the Publication is configured to apply a DC voltage to the focus ring. Further, the plasma processing apparatus disclosed in the Publication is configured to adjust a power level of a radio frequency power supplied to the lower electrode during the application of the DC voltage to the focus ring.

The present disclosure provides a technique for adjusting a plasma density near an edge of a substrate and a plasma density on a region of a substrate that is disposed inside of the edge of the substrate.

SUMMARY

In accordance with an aspect of the present disclosure, there is provided an apparatus for plasma processing including: a chamber; a substrate support having a lower electrode and an electrostatic chuck disposed on the lower electrode and configured to support a substrate mounted on the electrostatic chuck in the chamber; a radio frequency power supply configured to supply a radio frequency power to generate plasma in the chamber; a bias power supply configured to supply a bias power; a first electrical path that electrically connects the bias power supply with the lower electrode; a second electrical path that is different from the first electrical path and the lower electrode and configured to supply the bias power from the lower electrode or the first electrical path to an edge ring disposed to surround an edge of the substrate; and an impedance adjuster configured to provide a variable impedance to the second electrical path.

BRIEF DESCRIPTION OF THE DRAWINGS

The objects and features of the present disclosure will become apparent from the following description of embodiments, given in conjunction with the accompanying drawings, in which:

FIG. 11 shows a second electrical path of a plasma processing apparatus according to still another embodiment.

DETAILED DESCRIPTION

Figure 1:
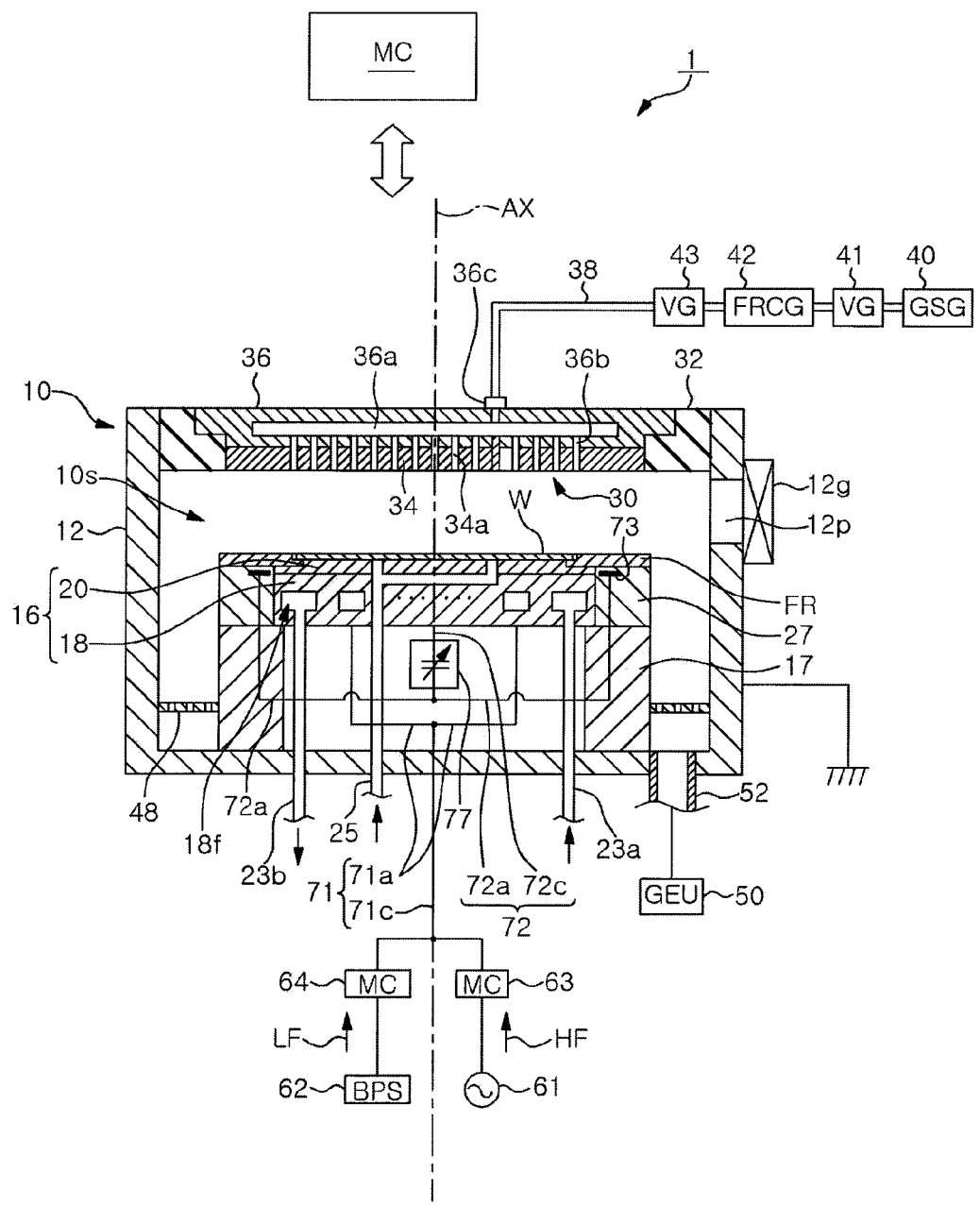
FIG. 1 schematically shows a plasma processing apparatus according to an embodiment.

Hereinafter, various embodiments will be described.

In one exemplary embodiment, an apparatus for plasma processing is provided. The apparatus includes a chamber, a substrate support, a radio frequency power supply, a bias power supply, a first electrical path, a second electrical path, and an impedance adjuster. The substrate support has a lower electrode and an electrostatic chuck. The electrostatic chuck is disposed on the lower electrode. The substrate support configured to support a substrate mounted on the electrostatic chuck in the chamber. An edge ring is disposed to surround an edge of the substrate. A radio frequency power supply is configured to supply a radio frequency power to generate plasma in the chamber. A bias power supply is configured to supply a bias power. A first electrical path electrically connects the bias power supply with the lower electrode. A second electrical path is an electrical path different from the first electrical path and the lower electrode. The second electrical path is configured to supply the bias power from the lower electrode or the first electrical path to the edge ring. An impedance adjuster provides a variable impedance to the second electrical path.

With such configuration, an impedance of the second electrical path can be controlled by the impedance adjuster. Further, a ratio of a power level of the power supplied to the substrate and a power level of the power supplied to the edge ring can be adjusted. Accordingly, it is possible to adjust a plasma density near the edge of the substrate and a plasma density on a region of the substrate which is disposed inside of the edge of the substrate. Further, the plasma processing apparatus can be simply configured by adding the second electrical path.

In one exemplary embodiment, the first electrical path may include a plurality of conductive lines. Further, the conductive lines electrically connect the lower electrode with the bias power supply and are connected to the lower electrode at multiple locations. The multiple locations have the same distance from a central axis of the lower electrode and arranged at equal intervals in a circumferential direction with respect to the central axis. With such configuration, power can be uniformly supplied to the lower electrode through the first electrical path.

In one exemplary embodiment, the first electrical path may further include a common conductive line. The common conductive line electrically connects each of the conductive lines and the bias power supply. Further, the conductive lines extend from the common conductive line in a radial direction with respect to the central axis and are arranged at equal intervals in the circumferential direction.

In one exemplary embodiment, the second electrical path may include a common conductive line. The common conductive line of the second electrical path electrically connects the lower electrode or the first electrical path with the impedance adjuster.

In one exemplary embodiment, the common conductive line of the second electrical path may extend from the lower electrode on the central axis of the lower electrode. The second electrical path may further include a plurality of conductive lines extending in the radial direction with respect to the central axis. Further, the impedance adjuster is electrically connected between the common conductive line of the second electrical path and each of the conductive lines of the second electrical path. The conductive lines of the second electrical path are configured to supply the bias power to the edge ring at multiple locations. The multiple locations have the same distance from the central axis and arranged at equal intervals in the circumferential direction with respect to the central axis. With such configuration, power can be uniformly supplied to the edge ring through the second electrical path.

In one exemplary embodiment, the conductive lines of the second electrical path may be arranged at equal intervals in the circumferential direction.

In one exemplary embodiment, the impedance adjuster may include a variable impedance element. Alternatively, the variable impedance element may be a variable capacitor.

In one exemplary embodiment, the variable capacitor may include a cylindrical conductor and a liquid supplier. The cylindrical conductor extends vertically around the common conductive line of the second electrical path and forms a container together with the common conductive line of the second electrical path. The liquid supplier is configured to supply dielectric liquid to the container.

In one exemplary embodiment, the impedance adjuster may include a variable capacitor. The variable capacitor may include a cylindrical conductor, a cylindrical dielectric and a driving device. The cylindrical conductor extends vertically around the common conductive line of the second electrical path. The cylindrical dielectric is disposed between the common conductive line of the second electrical path and the cylindrical conductor. The driving device is configured to move the cylindrical dielectric along the common conductive line of the second electrical path.

In one exemplary embodiment, the second electrical path may extend from the lower electrode and supply the bias power from the lower electrode to the edge ring.

In one exemplary embodiment, the bias power supply may be configured to generate, as the bias power, another radio frequency power having a frequency different from a frequency of the radio frequency power generated by the radio frequency power supply.

In one exemplary embodiment, the bias power supply may be configured to periodically generate a pulsed DC voltage as the bias power.

In one exemplary embodiment, the apparatus may further include a sheath adjuster. The sheath adjuster is configured to adjust a vertical position of a top end of a sheath above the edge ring.

In one exemplary embodiment, the sheath adjuster may include a power supply. The power supply is electrically connected to the second electrical path or the edge ring and configured to periodically generate a pulsed DC voltage.

In one exemplary embodiment, the sheath adjuster may include a power supply. The power supply is electrically connected to the second electrical path or the edge ring and configured to generate a radio frequency voltage.

In one exemplary embodiment, the sheath adjuster may include a DC power supply. The DC power supply is configured to apply a DC voltage to the edge ring through another electrical path connected to the edge ring.

In one exemplary embodiment, the sheath adjuster may be configured to move the edge ring upward to adjust the vertical position of a top surface of the edge ring.

Hereinafter, various embodiments will be described in detail with reference to the accompanying drawings. Like reference numerals will be given to like parts throughout the drawings.

FIG. 1 schematically shows a plasma processing apparatus according to an embodiment. A plasma processing apparatus 1 shown in FIG. 1 is a capacitively coupled plasma processing apparatus. The plasma processing apparatus 1 includes a chamber 10. The chamber 10 has therein an inner space 10s. A central axis of the inner space 10s coincides with an axis AX extending in a vertical direction. In one embodiment, the chamber 10 includes a chamber main body 12. The chamber main body 12 has a substantially cylindrical shape. The inner space 10s is disposed in the chamber main body 12. The chamber main body 12 is made of, e.g., aluminum. The chamber main body 12 is electrically grounded. A plasma resistant film is formed on an inner wall surface of the chamber main body 12, i.e., a wall surface that defines the inner space 10s. This film may be a film formed by anodic oxidation treatment or a ceramic film such as a film made of yttrium oxide.

A passage 12p is formed at a sidewall of the chamber main body 12. A substrate W is transferred between the inner space 10s and the outside of the chamber 10 through the passage 12p. A gate valve 12g is disposed along the sidewall of the chamber main body 12 to open and close the passage 12p.

The plasma processing apparatus 1 further includes a substrate support 16. The substrate support 16 is disposed in the chamber 10 to support the substrate W mounted thereon. The substrate W has a substantially disc shape. The substrate support 16 is supported by a supporting part 17. The supporting part 17 extends upward from a bottom portion of the chamber main body 12. The supporting part 17 has a substantially cylindrical shape. The supporting part 17 is made of an insulating material such as quartz.

The substrate support 16 includes a lower electrode 18 and an electrostatic chuck 20. The lower electrode 18 and the electrostatic chuck 20 are disposed in the chamber 10. The lower electrode 18 is made of a conductive material such as aluminum and has a substantially disc shape. A central axis of the lower electrode 18 coincides with the axis AX.

A flow path 18f is formed in the lower electrode 18. The flow path 18f is a channel for a heat exchange medium. As an example of the heat exchange medium, a liquid coolant or a coolant (e.g., Freon) for cooling the lower electrode 18 by vaporization of the coolant is used. A heat exchange medium supply device (e.g., a chiller unit) is connected to the flow path 18f. This supply device is disposed outside the chamber 10. The heat exchange medium is supplied from the supply device to the flow path 18f through a line 23a. The heat exchange medium supplied to the flow path 18f is returned to the supply device through a line 23b.

The electrostatic chuck 20 is disposed on the lower electrode 18. When the substrate W is processed in the inner space 10s, the substrate W is attracted to and held by the electrostatic chuck 20.

The electrostatic chuck 20 includes a main body and an electrode. The main body of the electrostatic chuck 20 is made of a dielectric material such as aluminum oxide or aluminum nitride. The main body of the electrostatic chuck 20 has a substantially disc shape. A central axis of the electrostatic chuck 20 substantially coincides with the axis AX. The electrode of the electrostatic chuck 20 is disposed in the main body. The electrode of the electrostatic chuck 20 has a film shape. A DC power supply is electrically connected to the electrode of the electrostatic chuck 20 through a switch. When a voltage is applied from the DC power supply to the electrode of the electrostatic chuck 20, an electrostatic attractive force is generated between the electrostatic chuck 20 and the substrate W. Due to the electrostatic attractive force thus generated, the substrate W is attracted to and held by the electrostatic chuck 20.

The electrostatic chuck 20 has a substrate mounting region. The substrate mounting region has a substantially disc shape. The central axis of the substrate mounting region substantially coincides with the axis AX. When the substrate W is processed in the chamber 10, the substrate W is mounted on a top surface of the substrate mounting region.

In one embodiment, the electrostatic chuck 20 may further include an edge ring mounting region. The edge ring mounting region extends in a circumferential direction to surround the substrate mounting region about the central axis of the electrostatic chuck 20. An edge ring FR is mounted on a top surface of the edge ring mounting region. The edge ring FR has a ring shape. The edge ring FR is mounted on the edge ring mounting region such that the central axis thereof coincides with the axis AX. The substrate W is disposed in a region surrounded by the edge ring FR. In other words, the edge ring FR is disposed to surround the edge of the substrate W. The edge ring FR may have conductivity. The edge ring FR is made of, e.g., silicon or silicon carbide. Alternatively, the edge ring FR may be made of a dielectric material such as quartz.

The plasma processing apparatus 1 may further include a gas supply line 25. The gas supply line 25 supplies a heat transfer gas, e.g., He gas, from a gas supply unit to a gap between a top surface of the electrostatic chuck 20 and a backside (bottom surface) of the substrate W.

The plasma processing apparatus 1 may further include an insulating region 27. The insulating region 27 is disposed on the supporting part 17. The insulating region 27 is disposed at an outer side of the lower electrode 18 in a radial direction with respect to the axis AX. The insulating region 27 extends in the circumferential direction along an outer peripheral surface of the lower electrode 18. The insulating region 27 is made of an insulator such as quartz. The edge ring FR is mounted on the insulating region 27 and the edge ring mounting region.

The plasma processing apparatus 1 further includes an upper electrode 30. The upper electrode 30 is disposed above the substrate support 16. The upper electrode 30 blocks an upper opening of the chamber main body 12 in cooperation with a member 32. The member 32 has an insulating property. The upper electrode 30 is held on an upper portion of the chamber main body 12 through the member 32.

The upper electrode 30 includes a ceiling plate 34 and a holder 36. A bottom surface of the ceiling plate 34 defines the inner space 10s. A plurality of gas injection holes 34a is formed in the ceiling plate 34. The gas injection holes 34a extend through the ceiling plate 34 in a plate thickness direction (vertical direction). The ceiling plate 34 is made of, e.g., silicon, but is not limited thereto. Alternatively, the ceiling plate 34 may have a structure in which a plasma resistant film is formed on a surface of an aluminum base member. This film may be a film formed by anodic oxidation treatment or a ceramic film such as a film made of yttrium oxide.

The holder 36 detachably holds the ceiling plate 34. The holder 36 is made of a conductive material such as aluminum. A gas diffusion space 36a is formed in the holder 36. A plurality of gas holes 36b extends downward from the gas diffusion space 36a. The gas holes 36b communicate with the gas injection holes 34a, respectively. A gas inlet port 36c is formed at the holder 36. The gas inlet port 36c is connected to the gas diffusion space 36a. A gas supply line 38 is connected to the gas inlet port 36c.

The gas supply line 38 is connected to a gas source group (GSG) 40 through a valve group (VG) 41, a flow rate controller group (FRCG) 42, and a valve group (VG) 43. The gas source group 40, the valve group 41, the flow rate controller group 42, and the valve group 43 constitute a gas supply unit. The gas source group 40 includes a plurality of gas sources. Each of the valve group 41 and the valve group 43 includes a plurality of valves (e.g., opening/closing valves). The flow rate controller group 42 includes a plurality of flow rate controllers. Each of the flow rate controllers of the flow rate controller group 42 is a mass flow controller or a pressure control type flow controller. The gas sources of the gas source group 40 are connected to the gas supply line 38 through the valves of the valve group 41 and the valve group 43, and the flow rate controllers of the flow rate controller group 42, respectively. The plasma processing apparatus 1 is configured to supply gases from one or more gas sources selected among the plurality of gas sources of the gas source group 40 to the inner space 10s at individually controlled flow rates.

A baffle plate 48 is disposed between the substrate support 16 or the supporting part 17 and the sidewall of the chamber main body 12. The baffle plate 48 may be formed by coating ceramic such as yttrium oxide on an aluminum-based member, for example. A plurality of through-holes is formed in the baffle plate 48. Below the baffle plate 48, a gas exhaust line 52 is connected to the bottom portion of the chamber main body 12. A gas exhaust unit (GEU) 50 is connected to the gas exhaust line 52, The gas exhaust unit includes a pressure controller such as an automatic pressure control valve, and a vacuum pump such as a turbo molecular pump to thereby decrease a pressure in the inner space 10s.

The plasma processing apparatus 1 may further include a radio frequency power supply 61. The radio frequency power supply 61 is configured to generate a radio frequency power HF to be supplied to generate plasma in the chamber 10.

The radio frequency power HF has a frequency within a range of 27 MHz to 100 MHz, e.g., 40 MHz or 60 MHz. The radio frequency power supply 61 is connected to the lower electrode 18 through a matching circuit (MC) 63 and a first electrical path 71 to supply the radio frequency power HF to the lower electrode 18. The matching circuit 63 is configured to match an output impedance of the radio frequency power supply 61 and an impedance of a load side (the lower electrode 18 side).

Figure 2:
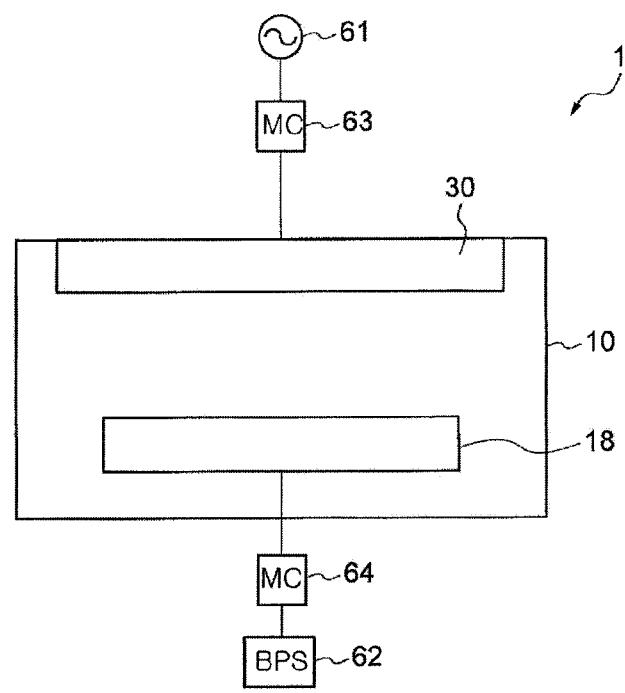
FIG. 2 schematically shows an example of a plasma processing apparatus in which a radio frequency power supply is connected to an upper electrode.

FIG. 2 schematically shows an example of a plasma processing apparatus in which the radio frequency power supply is connected to the upper electrode. As shown in FIG. 2, the radio frequency power supply 61 may not be electrically connected to the lower electrode 18, and may be connected to the upper electrode 30 through the matching circuit 63.

As shown in FIG. 1, the plasma processing apparatus 1 includes a bias power supply (BPS) 62. The bias power supply 62 is configured to generate a bias power LF. The bias power LF is used to attract ions to the substrate W. The bias power LF has a radio frequency component. The bias power LF may have periodicity.

In one embodiment, the bias power supply 62 may generate, as the bias power LF, a radio frequency power different from the radio frequency power HF. The frequency of the radio frequency power generated by the bias power supply 62 is different from that of the radio frequency power HF. The frequency of the radio frequency power generated by the bias power supply 62 may be lower than that of the radio frequency power HF. The frequency of the radio frequency power generated by the bias power supply 62 is within a range of 50 kHz to 27 MHz, e.g., 400 kHz. However, in the case when the radio frequency power supply 61 is connected to the upper electrode 30, the frequency of the radio frequency power generated by the bias power supply 62 may be lower than the frequency of the radio frequency power HF, may be higher than the frequency of the radio frequency power HF, or may be equal to the frequency of the radio frequency power HF. The bias power supply 62 is connected to the lower electrode 18 through a matching circuit (MC) 64 and the first electrical path 71 to supply the bias power LF to the lower electrode 18. The matching circuit 64 is configured to match an output impedance of the bias power supply 62 and the impedance of the load side (the lower electrode 18 side).

The radio frequency power as the bias power LF may be a pulsed radio frequency power that is generated periodically. In other words, the supply and the shut-off of the supply of the radio frequency power from the bias power supply 62 to the lower electrode 18 may be switched alternately.

In another embodiment, the bias power supply 62 may be configured to apply a pulsed DC voltage as the bias power LF to the lower electrode 18. The pulsed DC voltage may have a negative polarity. The pulsed DC voltage may be periodically applied to the lower electrode 18. A level of the pulsed DC voltage may change during the application of the pulsed DC voltage to the lower electrode 18.

The plasma processing apparatus 1 further includes the above-described first electrical path 71 and a second electrical path 72. As described above, the first electrical path 71 electrically connects the bias power supply 62 and the lower electrode 18.

The second electrical path 72 is an electrical path different from the first electrical path 71 and the lower electrode 18. In one embodiment, the second electrical path is formed to supply the bias power LF from the lower electrode 18 or the first electrical path 71 to the edge ring FR. In one embodiment, the second electrical path 72 extends from the lower electrode 18 to supply the bias power from the lower electrode 18 to the edge ring FR. In the embodiment shown in FIG. 1, the second electrical path 72 electrically connects the lower electrode 18 and one or more electrodes 73. One or more electrodes 73 are arranged directly below the edge ring FR. In one embodiment, one or more electrodes 73 are disposed in the insulating region 27. Alternatively, one or more electrode 73 may be disposed in the edge ring mounting region of the electrostatic chuck 20. The plasma processing apparatus 1 may include, as an example of one or more electrodes 73, a single annular electrode 73 extending around the axis AX. Alternatively, the plasma processing apparatus 1 may include, as another example of one or more electrodes 73, a plurality of electrodes 73 arranged along the circumferential direction with respect to the axis AX. The electrodes 73 may be arranged at equal intervals.

The plasma processing apparatus 1 further includes an impedance adjuster (IA) 77. The impedance adjuster 77 provides a variable impedance to the second electrical path 72. In one embodiment, the impedance adjuster 77 includes a variable impedance element. The variable impedance element is disposed on the second electrical path 72. The variable impedance element of the impedance adjuster 77 may be any element as long as it can change an impedance of the second electrical path 72. The variable impedance element of the impedance adjuster 77 may be formed as a single member or a plurality of members. In one embodiment, the variable impedance element of the impedance adjuster 77 may be a variable capacitor. One end of the variable capacitor is electrically connected to the lower electrode 18, and the other end of the variable capacitor is electrically connected to one or more electrodes 73. In another embodiment, the impedance adjuster 77 may be a circuit in which a plurality of series circuits is connected in parallel. Each of the series circuits may have a series connection between a fixed impedance element and a switching element. The fixed impedance element is, e.g., a fixed capacitor.

In one embodiment, the plasma processing apparatus 1 may further include a controller MC. The controller MC is a computer including a processor, a storage device, an input device, a display device, and the like, and controls the respective components of the plasma processing apparatus 1. Specifically, the controller MC executes a control program stored in the storage device, and controls the respective components of the plasma processing apparatus 1 based on recipe data stored in the storage device. A process specified by the recipe data is performed in the plasma processing apparatus 1 under the control of the controller MC.

In the case of performing plasma etching in the plasma processing apparatus 1, gas is first supplied to the inner space 10s. Then, the gas is excited in the inner space 10s by applying the radio frequency power HF and/or the bias power LF. Accordingly, plasma is generated in the inner space 10s. The substrate W is processed by chemical species such as ions and/or radicals from the plasma thus generated. For example, the substrate is etched.

In the plasma processing apparatus 1, an impedance of the second electrical path 72 can be controlled by the impedance adjuster 77. By controlling the impedance of the second electrical path 72, it is possible to control the ratio of the impedance of the electrical path including the lower electrode 18, the electrostatic chuck 20, and the substrate W and the impedance of the second electrical path 72. Therefore, in accordance with the plasma processing apparatus 1, a ratio of a power level of the power supplied to the substrate W and a power level of the power supplied to the edge ring FR can be adjusted. Accordingly, in accordance with the plasma processing apparatus 1, it is possible to adjust a plasma density near the edge of the substrate W and a plasma density on a region of the substrate W that is disposed inside of the edge of the substrate W. Further, the plasma processing apparatus 1 can be simply configured by adding the second electrical path 72. However, in the case of supplying the radio frequency power HF to the lower electrode 18 in addition to the bias power LF, both of the bias power LF and the radio frequency power HF are supplied to the edge ring FR through the second electrical path 72. In this case, since the radio frequency power HF in addition to the bias power LF are distributed to the substrate W and edge ring FR, the density of the plasma near the edge of the substrate W and the density of the plasma on the region of the substrate W which is disposed inside of the edge of the substrate can become uniform. Further, the impedance adjuster 77 can control the impedance of the second electrical path 72 to eliminate or reduce a difference between a top end position of the sheath (plasma sheath) above the substrate W and a top end position of the sheath above the edge ring FR. The top end position indicates the position of the top end in the vertical direction.

When the thickness of the edge ring FR is reduced due to the consumption, the top end position of the sheath above the edge ring FR 2 becomes lower than the top end position of the sheath above the substrate W. The top end position difference between the sheath above the substrate W and the sheath above the edge ring FR can be eliminated or reduced by decreasing the impedance of the second electrical path 72 to thereby increase the negative bias voltage to be applied to the edge ring FR. The impedance of the second electrical path 72 is controlled by the impedance adjuster 77. When the top end position difference between the sheath above the substrate W and the sheath above the edge ring FR is eliminated or reduced, ions are supplied perpendicular to the edge of the substrate W.

In the case of decreasing the impedance of the second electrical path 72 to thereby increase the negative bias voltage to be applied to the edge ring FR, the sheath above the edge ring FR becomes thicker. When the sheath above the edge ring FR becomes thicker, the impedance of the radio frequency power HF of the path from the second electrical path 72 to the plasma through the edge ring FR is increased. When the impedance of the second electrical path 72 is decreased to thereby increase the negative bias voltage to be applied to the edge ring FR, the power level of the power (the radio frequency power HF and/or the bias power LF) supplied to the edge ring FR is increased. Therefore, even if the impedance of the path from the second electrical path 72 to the plasma through the edge ring FR is increased due to the increase in the negative bias voltage to be applied to the edge ring FR, the decrease in the radio frequency power HF to be supplied to the edge ring FR is suppressed. Accordingly, it is possible to supply ions perpendicular to the edge of the substrate W while suppressing the difference between the plasma density near the edge of the substrate W and the plasma density on the region of the substrate W which is disposed inside of the edge of the substrate.

In one embodiment, the first electrical path 71 may be configured to uniformly distribute power to the lower electrode 18 in the circumferential direction with respect to the axis AX. In one embodiment, the first electrical path 71 may include a plurality of conductive lines 71a. The conductive lines 71a electrically connect the lower electrode 18 and the bias power supply 62, and are connect to the lower electrode 18 at multiple locations. The multiple locations have the same distance from the axis AX and are arranged at equal intervals in the circumferential direction with respect to the axis AX. In accordance with the present embodiment, it is possible to uniformly supply power to the lower electrode 18 through the first electrical path 71.

In one embodiment, the first electrical path 71 may further include a common conductive line 71c. The common conductive line 71c electrically connects each of the conductive lines 71a with the bias power supply 62. In other words, the conductive lines 71a are branched from the common conductive line 71c. The conductive lines 71a may extend from the common conductive line 71c along the radial direction with respect to the axis AX, and may be arranged at equal intervals in the circumferential direction with respect to the axis AX.

In one embodiment, the second electrical path 72 may be configured to uniformly distribute power to the edge ring FR in the circumferential direction with respect to the axis AX. In one embodiment, at least a part of the second electrical path 72 may extend on the axis AX. The impedance adjuster 77 may be disposed on the axis AX. In one embodiment, the second electrical path 72 may include a common conductive line 72c. The common conductive line 72c electrically connects the lower electrode 18 with the impedance adjuster 77. The number of the common conductive line 72c may be one or plural.

In one embodiment, the common conductive line 72c may extend from the lower electrode 18 on the axis AX. The second electrical path 72 may further include a plurality of conductive lines 72a. The conductive lines 72a extend in the radial direction with respect to the axis AX. In one embodiment, the conductive lines 72a may be arranged at equal intervals in the circumferential direction with respect to the axis AX.

The impedance adjuster 77 is electrically connected between the common conductive line 72c and each of the conductive lines 72a. The impedance adjuster 77 is disposed on the axis AX and may be connected to the common conductive line 72c on the axis AX. The conductive lines 72a are configured to supply the bias power LF to the edge ring at multiple locations. In one embodiment, the conductive lines 72a are connected to one or more electrodes 73 at multiple locations. The multiple locations may have the same distance from the axis AX, and may be arranged at equal intervals in the circumferential direction with respect to the axis AX. In accordance with the present embodiment, it is possible to uniformly supply power to the edge ring FR through the second electrical path 72.

Figure 3:
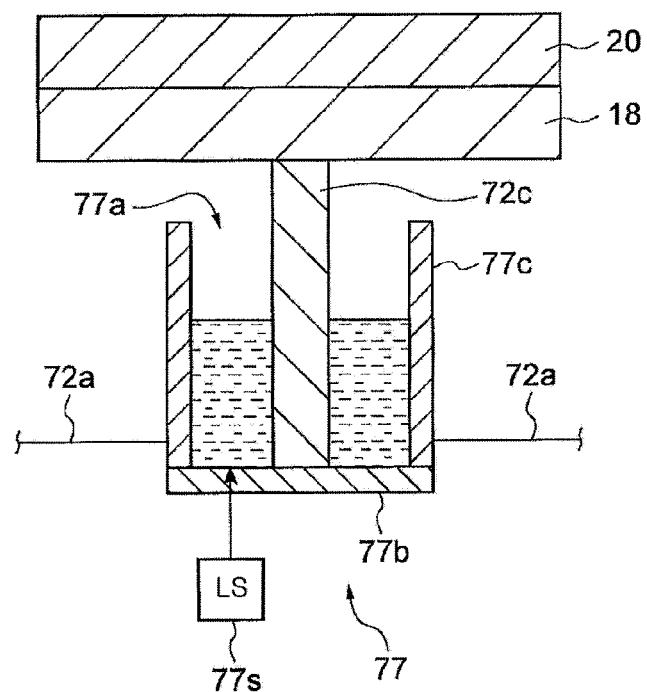
FIG. 3 schematically shows an exemplary structure of a variable capacitor serving as an impedance adjuster.

Hereinafter, the description will be made with reference to FIG. 3. FIG. 3 schematically shows an exemplary structure of a variable capacitor serving as an impedance adjuster. In one embodiment, as shown in FIG. 3, the variable capacitor serving as the impedance adjuster 77 may include a cylindrical conductor 77c and a liquid supplier (LS) 77s. In the present embodiment, the common conductive line 72c may be a rod-shaped (e.g., columnar) conductor. The cylindrical conductor 77c extends vertically around the common conductive line 72c. The conductive lines 72a are connected to the conductor 77c. The conductor 77c and the common conductive line 72c form a container 77a. The conductor 77c is separated from the common conductive line 72c. An opening between the conductor 77c and the common conductive line 72c may be blocked by a bottom portion 77b. The bottom portion 77b may be made of an insulating material. The liquid supplier 77s is configured to supply liquid into the container 77a. This liquid has a dielectric property. This liquid may be a fluorine-based coolant, but is not limited thereto. In the present embodiment, the capacitance of the variable capacitor serving as the impedance adjuster 77 can be controlled by controlling a volume of the liquid in the container 77a using the liquid supplier 77s.

Figure 4:
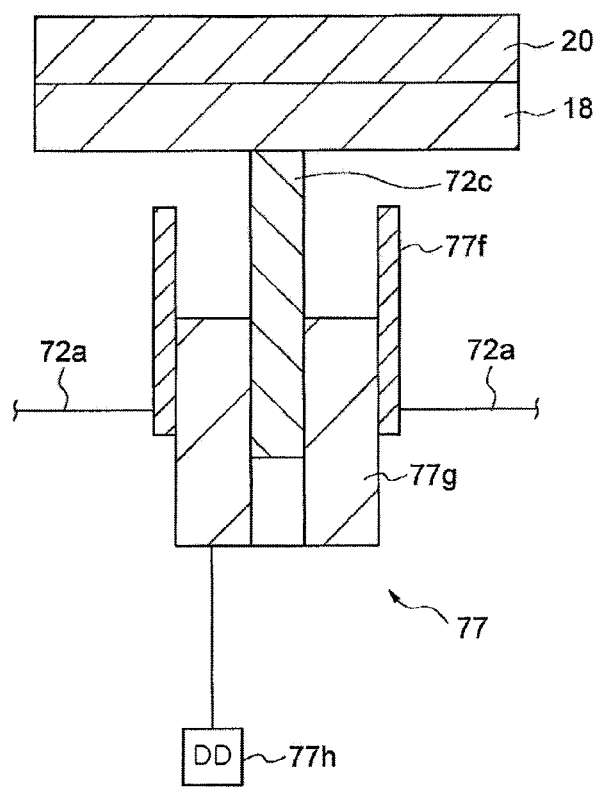
FIG. 4 schematically shows another exemplary structure of the variable capacitor serving as the impedance adjuster.

Hereinafter, the description will be made with reference to FIG. 4. FIG. 4 schematically shows another exemplary structure of the variable capacitor serving as the impedance adjuster. In one embodiment, the variable capacitor serving as the impedance adjuster 77 may include a cylindrical conductor 77f, a cylindrical dielectric 77g, and a driving device (DD) 77h. In the present embodiment, a common conductive line 72c may be a rod-shaped (e.g., columnar) conductor. The conductor 77f extends vertically around the common conductive line 72c. A plurality of conductive lines 72a is connected to the conductor 77f. The conductor 77f is separated from the common conductive line 72c. A cylindrical dielectric 77g is disposed between the common conductive line 72c and the conductor 77f. In other words, the common conductive line 72c is inserted into an inner hole of the dielectric 77g. The driving device 77h is configured to move the dielectric 77g along the common conductive line 72c. In the present embodiment, an insertion length of the dielectric 77g in the space between the common conductive line 72c and the cylindrical conductor 77f can be controlled by the driving device 77h. By controlling the insertion length, the capacitance of the variable capacitor serving as the impedance adjuster 77 can be controlled. The impedance adjuster 77 may include a variable impedance element having any structure as long as it can change capacitance or inductance.

Figure 5:
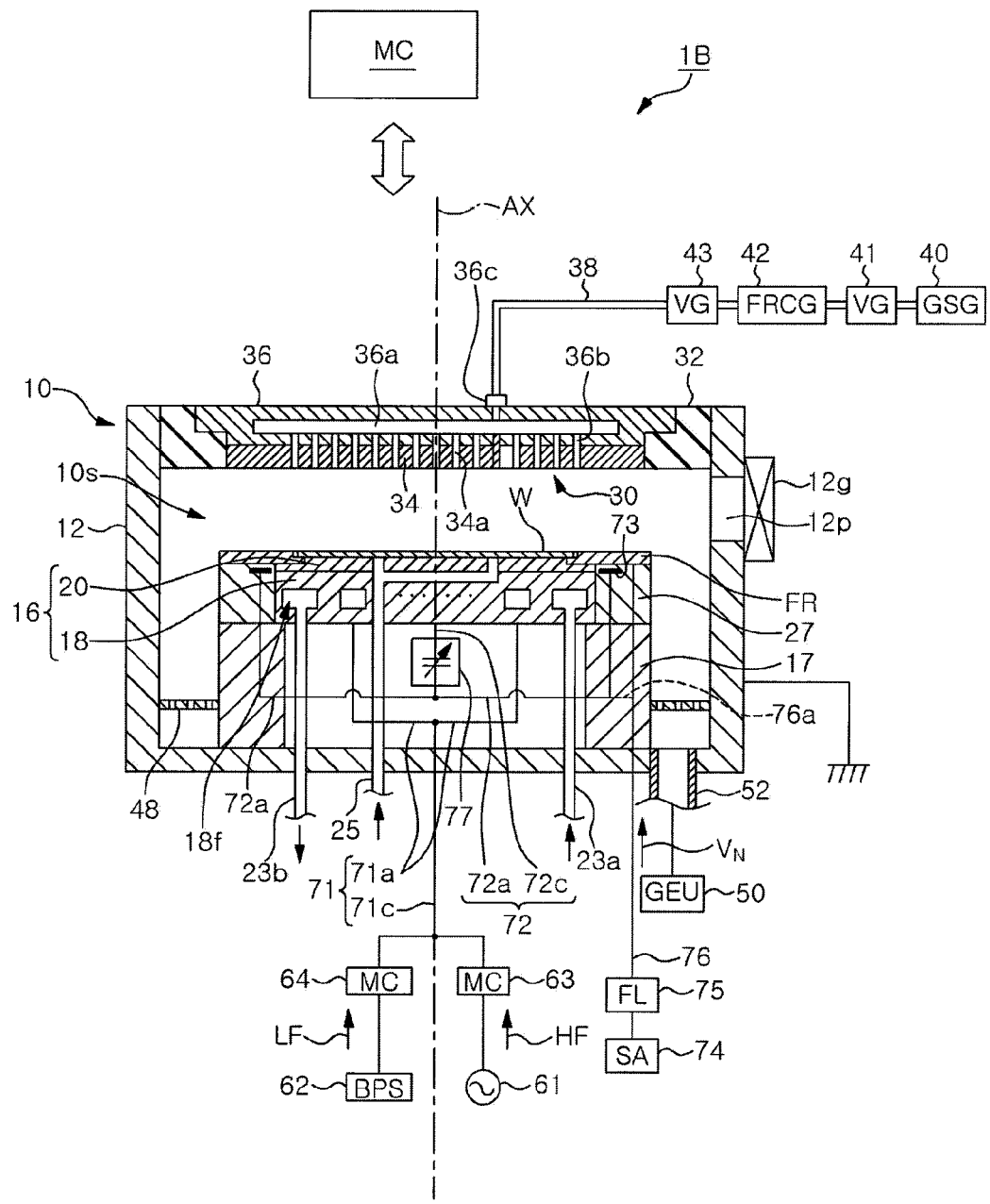
FIG. 5 schematically shows a plasma processing apparatus according to another embodiment.

Hereinafter, the description will be made with reference to FIG. 5. FIG. 5 schematically shows a plasma processing apparatus according to another embodiment. Hereinafter, only the differences between the plasma processing apparatus 1 shown in FIG. 1 and the plasma processing apparatus 1B shown in FIG. 5 will be described.

The plasma processing apparatus 1B further includes a sheath adjuster (SA) 74 to correct a traveling direction of ions supplied to the edge of the substrate W to be perpendicular to the edge of the substrate W. The sheath adjuster 74 is configured to adjust the top end position of the sheath above the edge ring FR. The sheath adjuster 74 adjusts the top end position of the sheath above the edge ring FR to eliminate or reduce the top end position difference between the sheath above the edge ring FR and the sheath above the substrate W.

The sheath adjuster 74 is a power supply configured to apply a voltage $V_N$ to the edge ring FR. The voltage $V_N$ may have a negative polarity. In the present embodiment, the sheath adjuster 74 is connected to the edge ring FR through a filter (FL) 75 and a conductive line 76. The filter 75 blocks or reduces a radio frequency power flowing into the sheath adjuster 74.

The voltage $V_N$ may be a DC voltage or a radio frequency voltage. A level of the voltage $V_N$ determines an adjustment amount of the top end position of the sheath above the edge ring FR. The adjustment amount of the top end position of the sheath above the edge ring FR, i.e., the level of the voltage $V_N$, is determined based on a parameter that relates to the thickness of the edge ring FR. This parameter may be an optically or electrically measured thickness of the edge ring FR, an optically or electrically measured vertical position of the top surface of the edge ring FR, or plasma exposing time of the edge ring FR. The level of the voltage $V_N$ is determined using a predetermined relationship between the parameter and the level of voltage $V_N$. For example, the predetermined relationship between the parameter and the level of the voltage $V_N$ is determined in advance such that an absolute value of the voltage $V_N$ is increased as the thickness of the edge ring FR is decreased. When the voltage $V_N$ having the determined level is applied to the edge ring FR, the top end position difference between the sheath above the edge ring FR and the sheath above the substrate W is eliminated or reduced.

In one embodiment, the level of the voltage $V_N$ can be determined by the controller MC. The predetermined relationship between the above-described parameter and the level of the voltage $V_N$ may be stored as a function or table format data in the storage device of the controller MC. The controller MC can control the sheath adjuster 74 to apply the voltage $V_N$ having the determined level to the edge ring FR.

The voltage $V_N$ may be a pulsed radio frequency voltage or a pulsed DC voltage. In other words, the voltage $V_N$ may be periodically applied to the edge ring FR. When a pulsed DC voltage is periodically applied as the voltage $V_N$ to the edge ring FR, the level of the voltage $V_N$ may change during the application of the voltage $V_N$ to the edge ring FR.

When the top end position of the sheath above the edge ring FR is corrected by the sheath adjuster 74, the impedance of the path from the second electrical path 72 to the plasma through the edge ring FR is increased. When the impedance of the path from the second electrical path 72 to the plasma through the edge ring FR is increased, the power level of the power (the radio frequency power HF and/or the bias power LF) supplied to the edge ring FR is decreased. On the other hand, the power level of the power (the radio frequency power HF and/or the bias power LF) supplied to the substrate W is relatively increased. The difference in the power level is eliminated or reduced by controlling the impedance of the second electrical path 72 using the impedance adjuster 77. Therefore, in accordance with the plasma processing apparatus 1B, the difference between the plasma density near the edge of the substrate W and the plasma density on the region of the substrate W which is disposed inside of the edge of the substrate W can be eliminated or reduced.

In the example shown in FIG. 5, the power supply serving as the sheath adjuster 74 is connected to the edge ring FR through the conductive line 76 as described above. However, this power supply may be connected to the second electrical path 72, instead of the edge ring FR, through the conductive line 76 as indicated by a dotted line 76a in FIG. 5.

Figure 6:
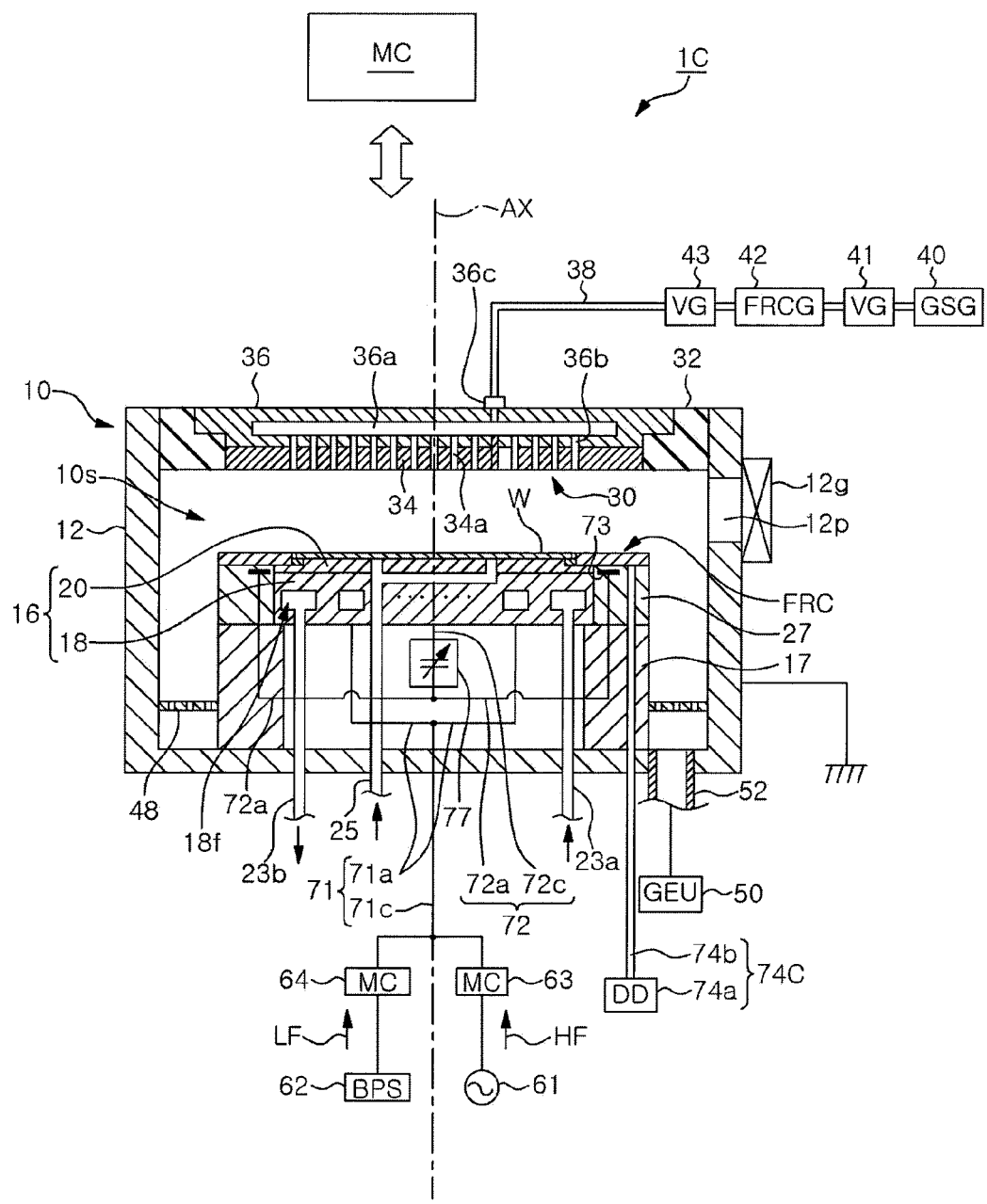
FIG. 6 schematically showing a plasma processing apparatus according to still another embodiment.
Figure 7:
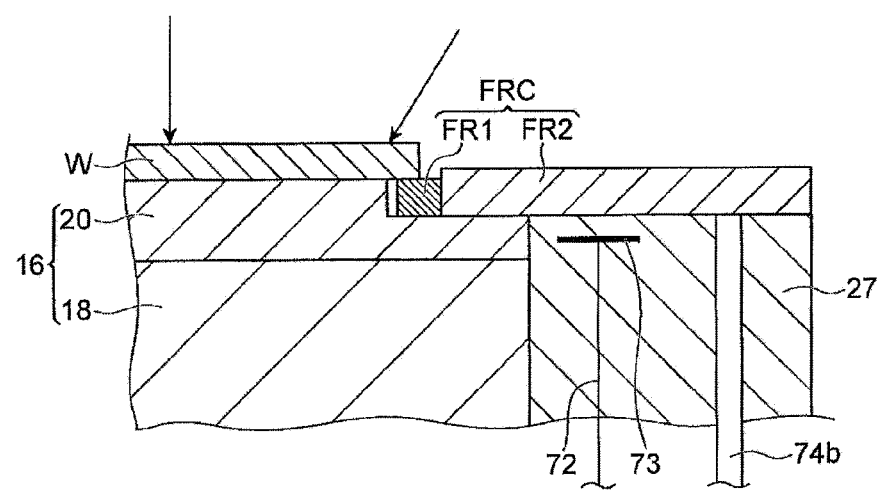
FIG. 7 shows an example of an edge ring used in the plasma processing apparatus shown in FIG. 6.

Hereinafter, the description will be made with reference to FIGS. 6 and 7. FIG. 6 schematically shows a plasma processing apparatus according to still another embodiment. FIG. 7 shows an example of an edge ring used in the plasma processing apparatus shown in FIG. 6. Hereinafter, only the differences between a plasma processing apparatus 1C shown in FIG. 6 and the plasma processing apparatus 1 shown in FIG. 1 will be described. As shown in FIGS. 6 and 7, the plasma processing apparatus 1C uses an edge ring FRC instead of the edge ring FR. The plasma processing apparatus 1C further includes a sheath adjuster 74C to correct a traveling direction of ions supplied to the edge of the substrate W to be perpendicular to the edge of the substrate W.

The edge ring FRC has a first annular part FR1 and a second annular part FR2. The first annular part FR1 and the second annular part FR2 are separated from each other. The first annular part FR1 has an annular plate shape, and is mounted on the edge ring mounting region to extend around the axis AX. The substrate W is mounted on the substrate mounting region such that the edge thereof is positioned on or above the first annular part FR1. The second annular part FR2 has an annular plate shape and is mounted on the edge ring mounting region to extend around the axis AX. The second annular part FR2 is disposed at a radially outer side of the first annular part FR1.

The sheath adjuster 74C is a device configured to move the edge ring FRC upward to adjust a vertical position of a top surface of the edge ring FRC. Specifically, the sheath adjuster 74C is configured to move the second annular part FR2 upward to adjust the vertical position of the top surface of the second annular part FR2. For example, the sheath adjuster 74C includes a driving device (DD) 74a and a shaft 74b. The shaft 74b supports the second annular part FR2 and extends downward from the second annular part FR2. The driving device 74a is configured to generate a driving force for vertically moving the second annular part FR2 through the shaft 74b.

When the thickness of the edge ring FRC is reduced due to the consumption, the top end position of the sheath above the edge ring FRC becomes lower than the top end position of the sheath above the substrate W. Accordingly, the top end of the sheath is inclined near the edge of the substrate W, and the traveling direction of ions supplied to the edge of the substrate W is inclined with respect to the vertical direction.

The sheath adjuster 74C is configured to adjust the top end position of the sheath above the edge ring FRC to correct the ion traveling direction to the vertical direction. The sheath adjuster 74C adjusts the top end position of the sheath above the edge ring FRC to eliminate or reduce the top end position difference between the sheath above the edge ring FRC and the sheath above the substrate W. Specifically, the sheath adjuster 74C moves the second annular part FR2 upward such that the vertical position of the top surface of the second annular part FR2 coincides with the vertical position of the top surface of the substrate W on the electrostatic chuck 20.

The adjustment amount of the top end position of the sheath, i.e., the movement amount of the second annular part FR2, is determined based on a parameter that relates to the thickness of the edge ring FRC, i.e., the thickness of the second annular part FR2. This parameter may be an optically or electrically measured thickness of the second annular part FR2, an optically or electrically measured vertical position of the top surface of the second annular part FR2, or plasma exposing time of the edge ring FRC. The movement amount of the second annular part FR2 is determined using a predetermined relationship between the parameter and the movement amount of the second annular part FR2. For example, the predetermined relationship between the parameter and the movement amount of the second annular part FR2 is determined in advance such that the movement amount of the second annular part FR2 is increased when the thickness of the second annular part FR2 is decreased. When the second annular part FR2 is moved upward by the determined movement amount, the top end position difference between the sheath above the edge ring FRC and the sheath above the substrate W is eliminated or reduced.

In the plasma processing apparatus 1C, the controller MC determines the movement amount of the second annular part FR2 as described above. The predetermined relationship between the above-described parameter and the movement amount of the second annular part FR2 may be stored in the storage device of the controller MC as a function or table format data. The controller MC controls the sheath adjuster 74C to move the second annular part FR2 upward by the determined movement amount.

When the top end position of the sheath is corrected by the sheath adjuster 74C, the impedance of the path from the second electrical path 72 to the plasma through the edge ring FRC is increased. This is because the gap between the second annular part FR2 and the electrode 73 is widened. When the impedance of the path from the second electrical path 72 to the plasma through the edge ring FRC is increased, the power level of the power (the radio frequency power HF and/or the bias power LF) supplied to the edge ring FRC is decreased. On the other hand, the power level of the power (the radio frequency power HF and/or the bias power LF) supplied to the substrate W is relatively increased. The difference in the power level is eliminated or reduced by controlling the impedance of the second electrical path 72 using the impedance adjuster (IA) 77. Therefore, in accordance with the plasma processing apparatus 1C, it is possible to eliminate or reduce the difference between the plasma density near the edge of the substrate W and the plasma density on the region of the substrate W which is disposed inside of the edge of the substrate W.

Figure 8:
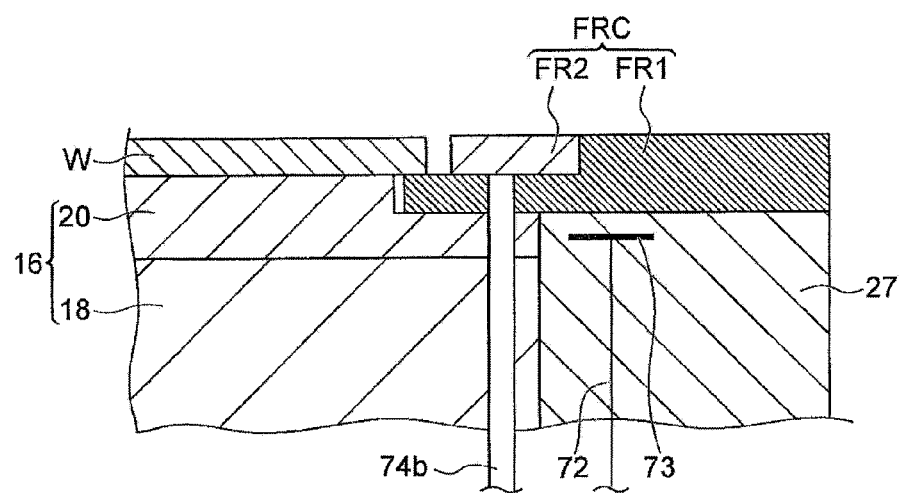
FIG. 8 shows another example of the edge ring.

FIG. 8 shows another example of the edge ring. In the edge ring FRC shown in FIG. 8, the first annular part FR1 has an inner peripheral portion and an outer peripheral portion. A vertical position of a top surface of the inner peripheral portion is lower than a vertical position of a top surface of the outer peripheral portion. The substrate W is mounted on the substrate mounting region such that the edge thereof is positioned on or above the inner peripheral portion of the first annular part FR1. The second annular part FR2 is disposed on the inner peripheral portion of the first annular part FR1 to surround the edge of the substrate W. In other words, in the edge ring FRC shown in FIG. 8, the second annular part FR2 is disposed at a radially inner side of the outer peripheral portion of the first annular part FR1. In the case of using the edge ring FRC shown in FIG. 8, the shaft 74b of the sheath adjuster 74C extends downward from the second annular part FR2 while penetrating through the inner peripheral portion of the first annular part FR1.

Figure 9:
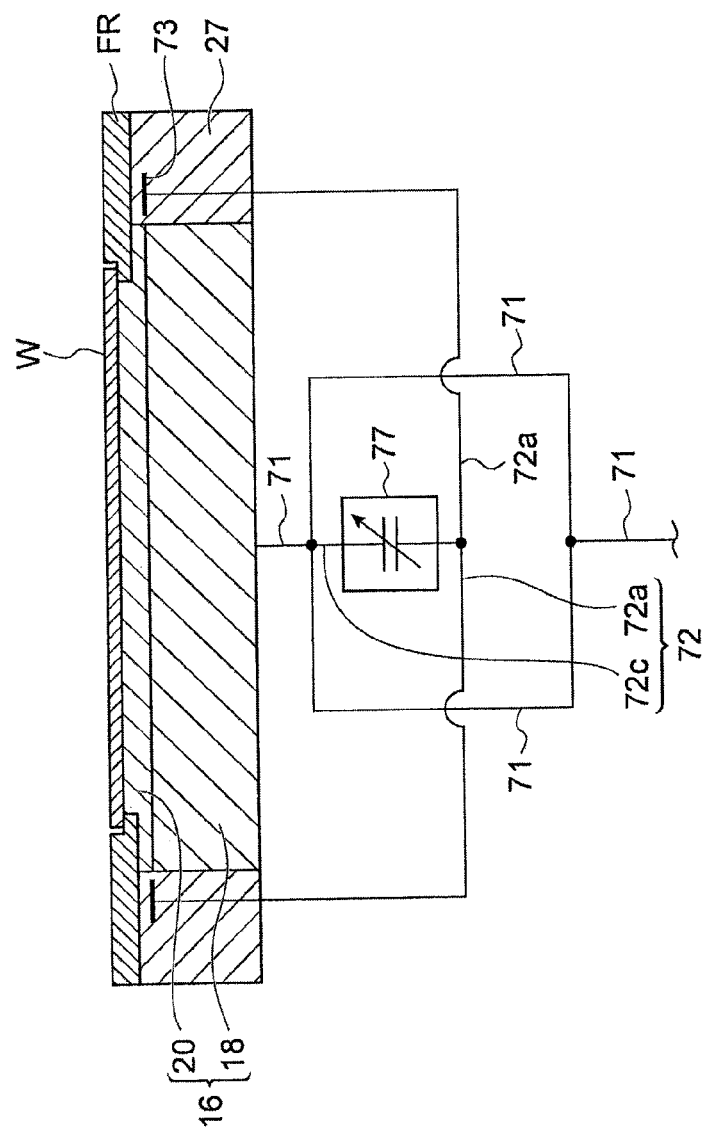
FIG. 9 shows a second electrical path of a plasma processing apparatus according to still another embodiment.
Figure 10:
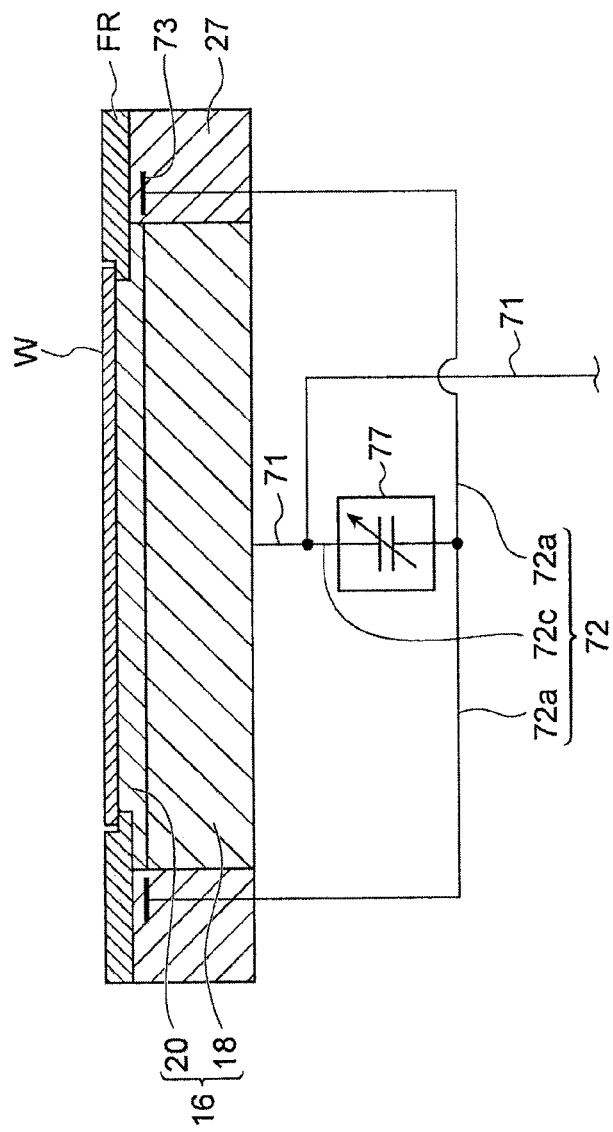
FIG. 10 shows a second electrical path of a plasma processing apparatus according to still another embodiment.

Hereinafter, the description will be made with reference to FIGS. 9 and 10. FIGS. 9 and 10 each shows a second electrical path of a plasma processing apparatus according to still another embodiment. Hereinafter, only the differences between the second electrical paths 72 shown in FIGS. 9 and 10 and the second electrical paths of the plasma processing apparatuses of the above-described embodiments will be described. The second electrical path 72 shown in each of FIGS. 9 and 10 is formed to supply the bias power LF from the first electrical path 71 to the edge ring FR. In other words, the second electrical path 72 shown in each of FIGS. 9 and 10 extends from the first electrical path 71, instead of the lower electrode 18. Specifically, a common conductive line 72c of the second electrical path 72 shown in each of FIGS. 9 and 10 is connected between the first electrical path 71 and the impedance adjuster 77. The first electrical path 71 shown in FIG. 9 is branched from the common conductive line to a plurality of conductive lines. The conductive lines of the first electrical path 71 extend in a space around the impedance adjuster 77 and join with the common conductive line connected to the lower electrode 18. On the other hand, the first electrical path 71 shown in FIG. 10 is not branched between one end and the other end.

Hereinafter, the description will be made with reference to FIG. 11. FIG. 11 shows a second electrical path 72 of a plasma processing apparatus according to still another embodiment. As shown in FIG. 11, the impedance adjuster 77 may not be disposed on the axis AX. Further, as shown in FIG. 11, a plurality of second electrical paths 72 and a plurality of impedance adjusters 77 may be used. Each of the second electrical paths 72 supplies the bias power LF from the lower electrode 18 to the edge ring FR. In the example shown in FIG. 11, each of the second electrical paths 72 connects the lower electrode 18 to one or more electrodes 73. The impedance adjusters 77 apply variable impedances to the second electrical paths 72, respectively. Each of the impedance adjusters 77 may have the same configuration as those of the impedance adjusters 77 in the above-described embodiments. The second electrical paths 72 may be arranged to be rotationally symmetrical about the axis AX. The impedance adjusters 77 may be arranged to be rotationally symmetrical about the axis AX. The impedance adjusters 77 may be connected to one or more electrodes 73 through multiple wirings respectively connected at multiple contact points to one or more electrodes 73.

While various embodiments have been described above, various omissions, substitutions, and changes may be made without being limited to the above-described embodiments. It is also possible to combine elements in different embodiments to form other embodiments.

The plasma processing apparatus according to still another embodiment may be a capacitively coupled plasma processing apparatus different from the plasma processing apparatuses 1, 1B, and 1C. The plasma processing apparatus according to still another embodiment may be an inductively coupled plasma processing apparatus. The plasma processing apparatus according to still another embodiment may by an electron cyclotron resonance (ECR) plasma processing apparatus. The plasma processing apparatus according to still another embodiment may be a plasma processing apparatus that generates plasma using surface waves such as microwaves.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. An apparatus for plasma processing comprising:
a chamber;
a substrate support, having a lower electrode and an electrostatic chuck, configured to support a substrate on the electrostatic chuck in the chamber;
a radio frequency power supply configured to supply a radio frequency power to generate plasma in the chamber;
a bias power supply configured to supply a bias power;
a first electrical path that electrically connects the bias power supply with the lower electrode;
a second electrical path that is different from the first electrical path and the lower electrode and configured to supply the bias power from the lower electrode or the first electrical path to an edge ring disposed to surround an edge of the substrate; and
an impedance adjuster configured to provide a variable impedance to the second electrical path,
wherein the second electrical path includes a plurality of conductive lines each connected to the impedance adjuster, each of the conductive lines of the second electrical path extending from the impedance adjuster in a direction away from a central axis of the lower electrode, and the conductive lines of the second electrical path are configured to supply the bias power to the edge ring at multiple locations having the same distance from the central axis, the multiple locations being arranged at equal intervals in the circumferential direction with respect to the central axis.

2. The apparatus of claim 1, wherein the first electrical path includes a plurality of conductive lines, and
the conductive lines of the first electrical path electrically connect the lower electrode with the bias power supply and are connected to the lower electrode at multiple locations having the same distance from the central axis of the lower electrode, the multiple locations being arranged at equal intervals in the circumferential direction with respect to the central axis.

3. The apparatus of claim 2, wherein the first electrical path further includes a common conductive line that electrically connects each of the conductive lines of the first electrical path and the bias power supply, and
the conductive lines of the first electrical path extend from the common conductive line in a radial direction with respect to the central axis and are arranged at equal intervals in the circumferential direction.

4. The apparatus of claim 1, wherein the second electrical path includes a common conductive line that electrically connects the lower electrode or the first electrical path with the impedance adjuster.

5. The apparatus of claim 4, wherein the impedance adjuster includes a variable capacitor,
wherein the variable capacitor includes:
a cylindrical conductor extending vertically around the common conductive line of the second electrical path and forming a container together with the common conductive line of the second electrical path; and
a liquid supplier configured to supply dielectric liquid to the container.

6. The apparatus of claim 4, wherein the impedance adjuster includes a variable capacitor,
wherein the variable capacitor includes:
a cylindrical conductor extending vertically around the common conductive line of the second electrical path;
a cylindrical dielectric disposed between the common conductive line of the second electrical path and the cylindrical conductor; and
a driving device configured to move the cylindrical dielectric along the common conductive line of the second electrical path.

7. The apparatus of claim 1, wherein the impedance adjuster includes a variable impedance element.

8. The apparatus of claim 7, wherein the variable impedance element is a variable capacitor.

9. The apparatus of claim 1, wherein the second electrical path extends from the lower electrode such that the bias power is supplied from the lower electrode to the edge ring therethrough.

10. The apparatus of claim 1, wherein the bias power supply is configured to generate, as the bias power, another radio frequency power having a frequency different from a frequency of the radio frequency power generated by the radio frequency power supply.

11. The apparatus of claim 1, wherein the bias power supply is configured to periodically generate a pulsed DC voltage as the bias power.

12. The apparatus of claim 1, further comprising:
a sheath adjuster configured to adjust a vertical position of a top end of a sheath above the edge ring.

13. The apparatus of claim 12, wherein the sheath adjuster includes a power supply that is electrically connected to the second electrical path or the edge ring and configured to periodically generate a pulsed DC voltage.

14. The apparatus of claim 12, wherein the sheath adjuster includes a power supply that is electrically connected to the second electrical path or the edge ring and configured to generate a radio frequency voltage.

15. The apparatus of claim 12, wherein the sheath adjuster includes a DC power supply configured to apply a DC voltage to the edge ring through another electrical path connected to the edge ring.

16. The apparatus of claim 12, wherein the sheath adjuster is configured to move the edge ring upward to adjust the vertical position of a top surface of the edge ring.

17. An apparatus for plasma processing comprising:
a chamber;
a substrate support, having a lower electrode and an electrostatic chuck, configured to support a substrate on the electrostatic chuck in the chamber;
a radio frequency power supply configured to supply a radio frequency power to generate plasma in the chamber;
a bias power supply configured to supply a bias power;
a first electrical path that electrically connects the bias power supply with the lower electrode;
a second electrical path that is different from the first electrical path and the lower electrode and configured to supply the bias power from the lower electrode or the first electrical path to an edge ring disposed to surround an edge of the substrate; and
an impedance adjuster configured to provide a variable impedance to the second electrical path,
wherein the second electrical path includes a common conductive line that electrically connects the lower electrode or the first electrical path with the impedance adjuster,
wherein the common conductive line of the second electrical path extends from the lower electrode on a central axis of the lower electrode,
the second electrical path further includes a plurality of conductive lines extending in the radial direction with respect to the central axis,
the impedance adjuster is electrically connected between the common conductive line of the second electrical path and each of the conductive lines of the second electrical path, and
the conductive lines of the second electrical path are configured to supply the bias power to the edge ring at multiple locations having the same distance from the central axis, the multiple locations being arranged at equal intervals in the circumferential direction with respect to the central axis.

18. The apparatus of claim 17, wherein the conductive lines of the second electrical path are arranged at equal intervals in the circumferential direction.

19. An apparatus for plasma processing comprising:
a chamber;
a substrate support, having a lower electrode and an electrostatic chuck, configured to support a substrate on the electrostatic chuck in the chamber;
a radio frequency power supply configured to supply a radio frequency power to generate plasma in the chamber;
a bias power supply configured to supply a bias power;
a first electrical path that electrically connects the bias power supply with the lower electrode;
a second electrical path that is different from the first electrical path and the lower electrode and configured to supply the bias power from the lower electrode or the first electrical path to an edge ring disposed to surround an edge of the substrate; and
an impedance adjuster configured to provide a variable impedance to the second electrical path,
wherein the first electrical path includes a first plurality of conductive lines,
the first plurality of conductive lines electrically connect the lower electrode with the bias power supply and are connected to the lower electrode at multiple locations having the same distance from a central axis of the lower electrode, the multiple locations being arranged at equal intervals in a circumferential direction with respect to the central axis,
the first electrical path further includes a common conductive line that electrically connects each of the first plurality of conductive lines and the bias power supply,
the first plurality of conductive lines extend from the common conductive line in a radial direction with respect to the central axis and are arranged at equal intervals in the circumferential direction, and
the second electrical path includes a common conductive line that electrically connects the lower electrode or the first electrical path with the impedance adjuster, the second electrical path including a second plurality of conductive lines with the impedance adjuster electrically connected between the common conductive line and each of the second plurality of conductive lines, the second plurality of conductive lines are configured to supply the bias power to the edge ring at multiple locations having the same distance from the central axis, and the multiple locations are arranged at equal intervals in the circumferential direction with respect to the central axis.

20. The apparatus of claim 1, wherein the conductive lines of the second electrical path are arranged at equal intervals in the circumferential direction.

* * * * *